(12) United States Patent
Chen

(10) Patent No.: US 7,077,188 B2
(45) Date of Patent: Jul. 18, 2006

(54) HEAT DISSIPATING DEVICE WITH HEAT CONDUCTIVE TUBES

(76) Inventor: Shyh-Ming Chen, 235 Chung–Ho Box 8-24, Taipei (TW)

( * ) Notice: Subject to any disclaimer, the term of this patent is extended or adjusted under 35 U.S.C. 154(b) by 0 days.

(21) Appl. No.: 10/950,293

(22) Filed: Sep. 27, 2004

(65) Prior Publication Data

US 2006/0070721 A1    Apr. 6, 2006

(51) Int. Cl.
*F28F 7/00*    (2006.01)
(52) U.S. Cl. .............................. 165/80.3; 165/104.33; 361/697; 361/704; 257/714; 174/15.2
(58) Field of Classification Search ........... 165/104.33, 165/104.21, 104.19, 185, 80.3, 80.4; 361/697, 361/699, 700, 704; 257/714–716
See application file for complete search history.

(56) References Cited

U.S. PATENT DOCUMENTS

| | | | | |
|---|---|---|---|---|
| 5,020,586 A | * | 6/1991 | Mansingh | 165/80.3 |
| 5,499,450 A | * | 3/1996 | Jacoby | 29/890.03 |
| 5,950,721 A | * | 9/1999 | Bock et al. | 165/185 |
| 6,085,830 A | * | 7/2000 | Mashiko et al. | 165/80.3 |
| 6,758,262 B1 | * | 7/2004 | Kawabata et al. | 165/80.3 |
| 2005/0066487 A1 | * | 3/2005 | Zhang | 24/457 |

* cited by examiner

*Primary Examiner*—Terrell McKinnon

(57) ABSTRACT

A heat dissipating device with heat conductive tubes comprises a heat dissipating unit including a plurality of fins; a bottom edge of each fin having a plurality of concave portions; a seat; a surface of the seat having a plurality of protruding surfaces; a top of the seat having a plurality of trenches; each trench being parallel to at least one protruding surface; a plurality of recesses being vertically passing through the plurality of trenches; the concave portions being formed corresponding to the trenches; the fins are inserted into the recesses and the concave portions cover upon the trenches; a plurality of heat conductive tubes; one end of each heat conductive tube being installed between one respective trench and respective concave portions of the plurality of concave portions so that the heat conductive tubes are positioned in the seat. A method for forming the unit is included.

2 Claims, 7 Drawing Sheets

HEAT DISSIPATING DEVICE WITH HEAT CONDUCTIVE TUBES

FIELD OF THE INVENTION

The present invention relates to heat dissipation, and particular to a heat dissipating device with heat conductive tubes, wherein the device can be used in the heat dissipation of a center processing unit or electronic devices. A shaping mold is used to punch the seat so that the fins and thus the heat conductive tubes are tightly riveted in the seat.

BACKGROUND OF THE INVENTION

With reference to FIG. 1, the prior art way for combining the heat conductive tubes and heat dissipating unit are illustrated. Firstly, the seat 51 is welded to the heat conductive tubes 50. A plurality of fins are engaged to a plurality of heat conductive tubes 50 by punching one by one. In the welding process, welding material is coated upon the welding surfaces of the heat conductive tubes 50 and the seat 51. Then they are placed in a vacuum furnace for heating so that the welding material will permeate into the combining surfaces. After cooling, the welding process is completed. However, the process is long and it is very complicated for controlling the time sequence. In the process, poisonous harmful material will generate, which is harmful to human bodies and environment. The welding material contains lead and other heavy metals. Thereby, the process is not suitable to be used. Furthermore, the punching process is performed one by one. The combination of the fins 52 and the heat conductive tubes 52 will be affected by the vibration of the punching machine so that gaps are formed between the fins 52 and the heat conductive tubes 50. Thereby, heat convention ability is reduced and thus the yield ratio is decreased.

To improve above mentioned defect, a novel method is disclosed. With reference to FIG. 2, the heat conductive tube 60 passes through one side of the fin 61. Then it is placed on a top of a bottom plate 62 of a central processing unit (not shown). The heat conductive tube is bent by a punching unit 62 and is then buckled. Thereby, heat of the central processing unit transfers through the bottom plate 62 to the heat conductive tube 60 and the fin 61 and thus disperses out from the fin 61. However, the heat conductive tube 60 is buckled so that gaps are formed between the heat conductive tube 60 and the fin 61 or the bottom plate 62. As a result, heat resistance is high and heat convention is low and thus heat dissipation is reduced. The heat conductive tube 60 has no effect in heat dissipation.

SUMMARY OF THE INVENTION

Accordingly, the primary object of the present invention is to provide a heat dissipating device with heat conductive tubes, wherein the device can be used in the heat dissipation of a center processing unit or electronic devices. A shaping mold is used to punch the seat so that the fins and thus the heat conductive tubes are tightly riveted in the seat.

To achieve above object, the present invention provides a heat dissipating device with heat conductive tubes which comprises a heat dissipating unit including a plurality of fins; a bottom edge of each fin having a plurality of concave portions; a seat; a surface of the seat having a plurality of protruding surfaces; a top of the seat having a plurality of trenches; each trench being parallel to at least one protruding surface; a plurality of recesses being vertically passing through the plurality of trenches; the concave portions being formed corresponding to the trenches. The fins are inserted into the recesses and the concave portions cover upon the trenches; a plurality of heat conductive tubes; one end of each heat conductive tube being installed between one respective trench and respective concave portions of the plurality of concave portions so that the heat conductive tubes are positioned in the seat. A method for forming the device is included.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
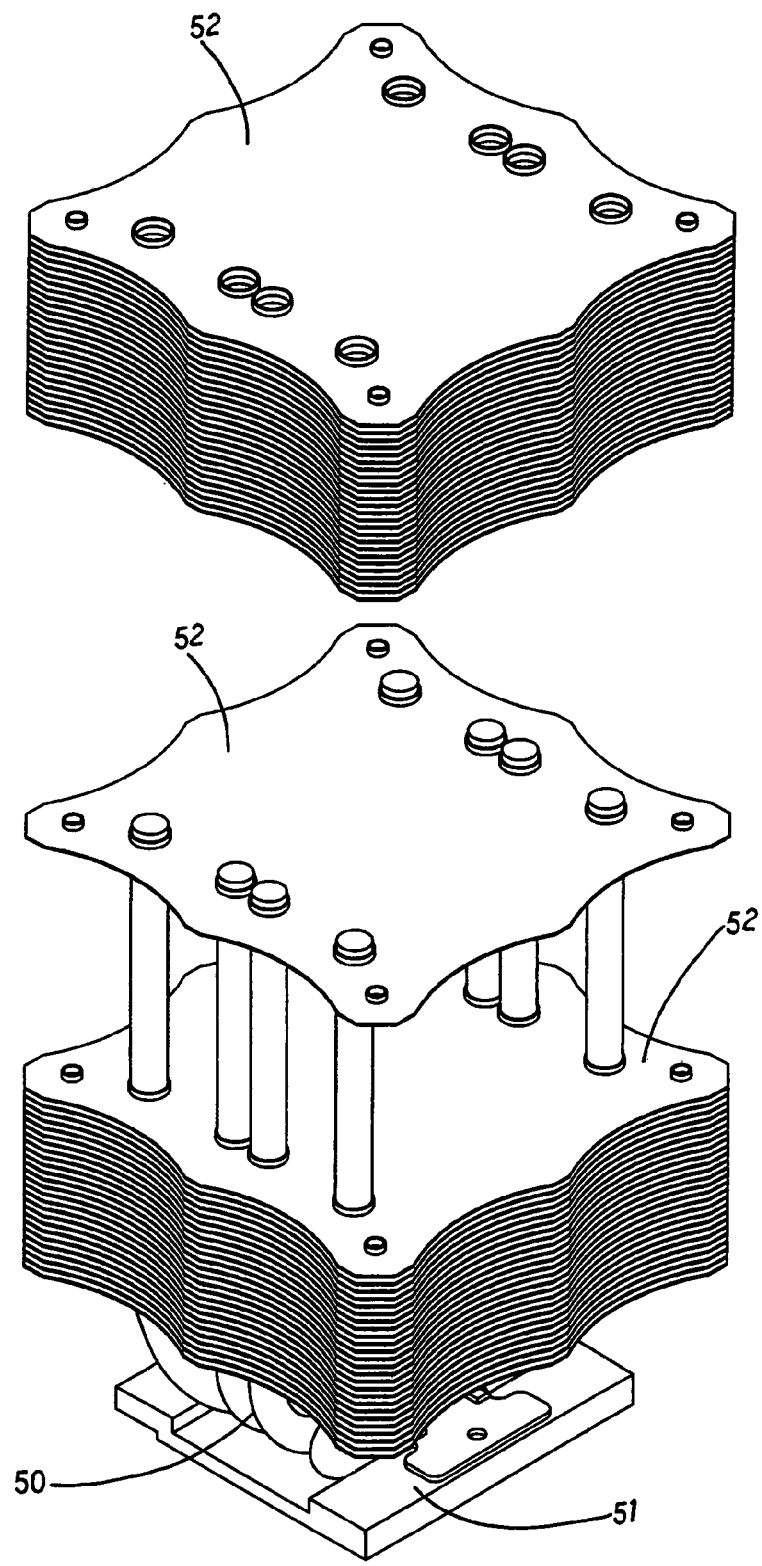
FIG. 1 is a schematic view showing the assembly of the prior art heat conductive tubes and the heat dissipating device.
Figure 2:
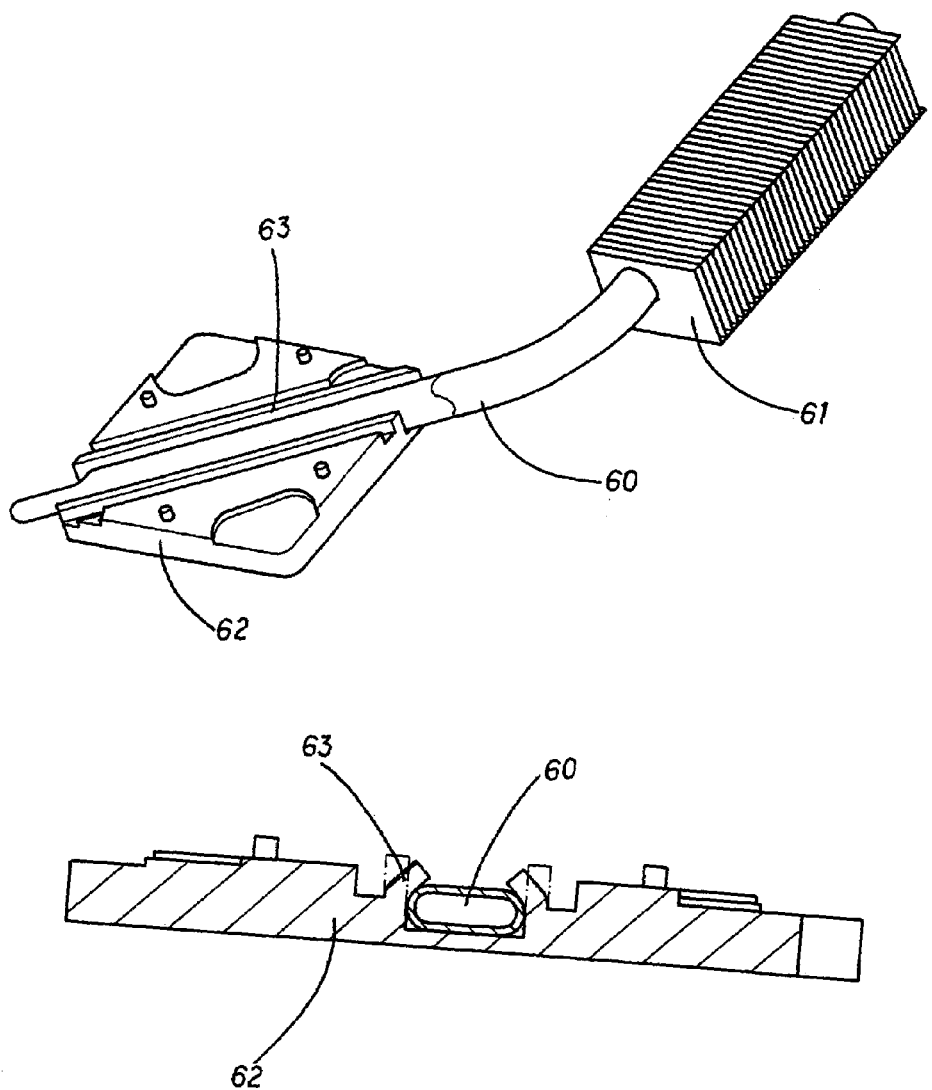
FIG. 2 is a schematic view showing the assembly of another heat dissipating device and fins.
Figure 3:
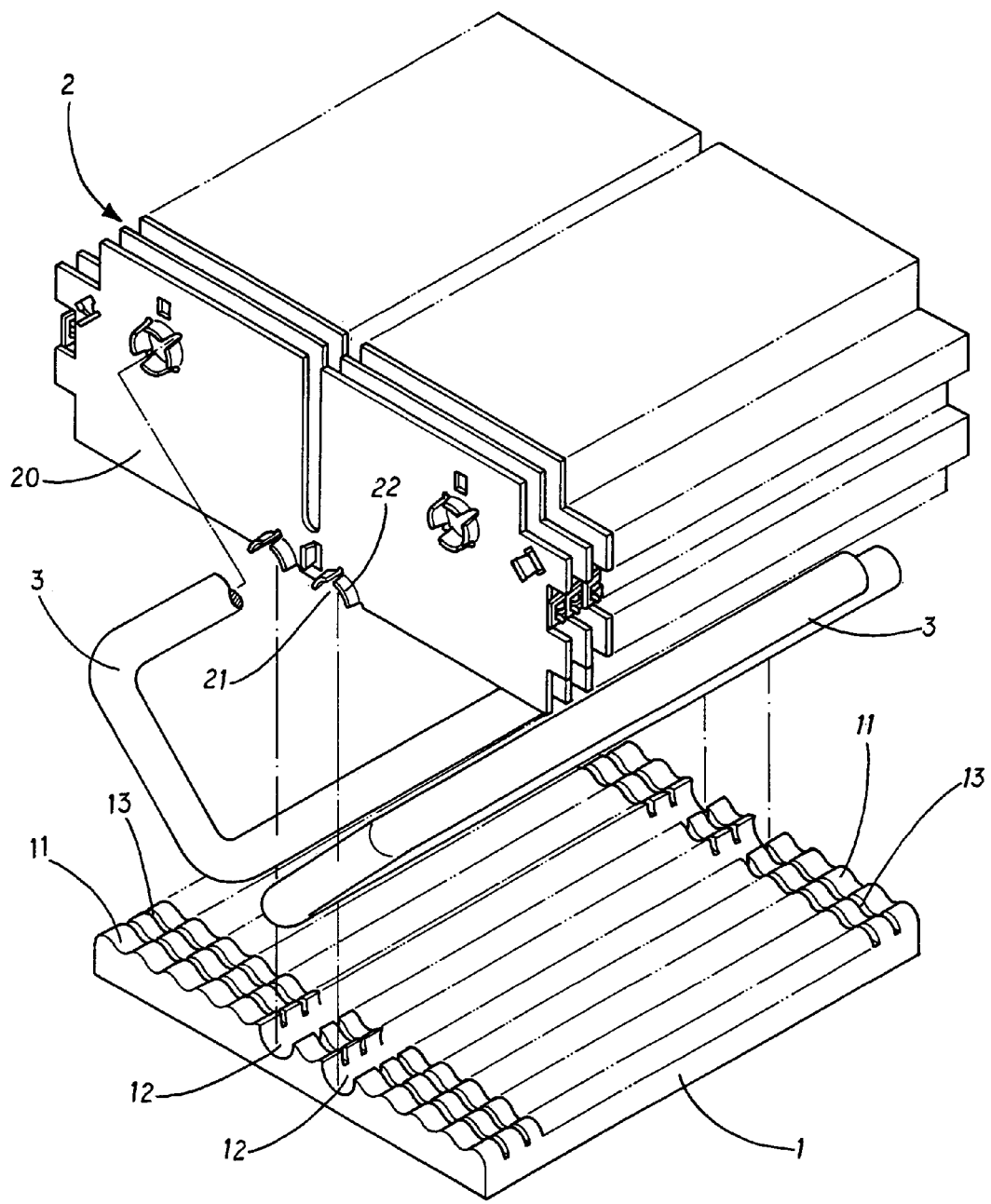
FIG. 3 is an exploded perspective view of the present invention.
Figure 4:
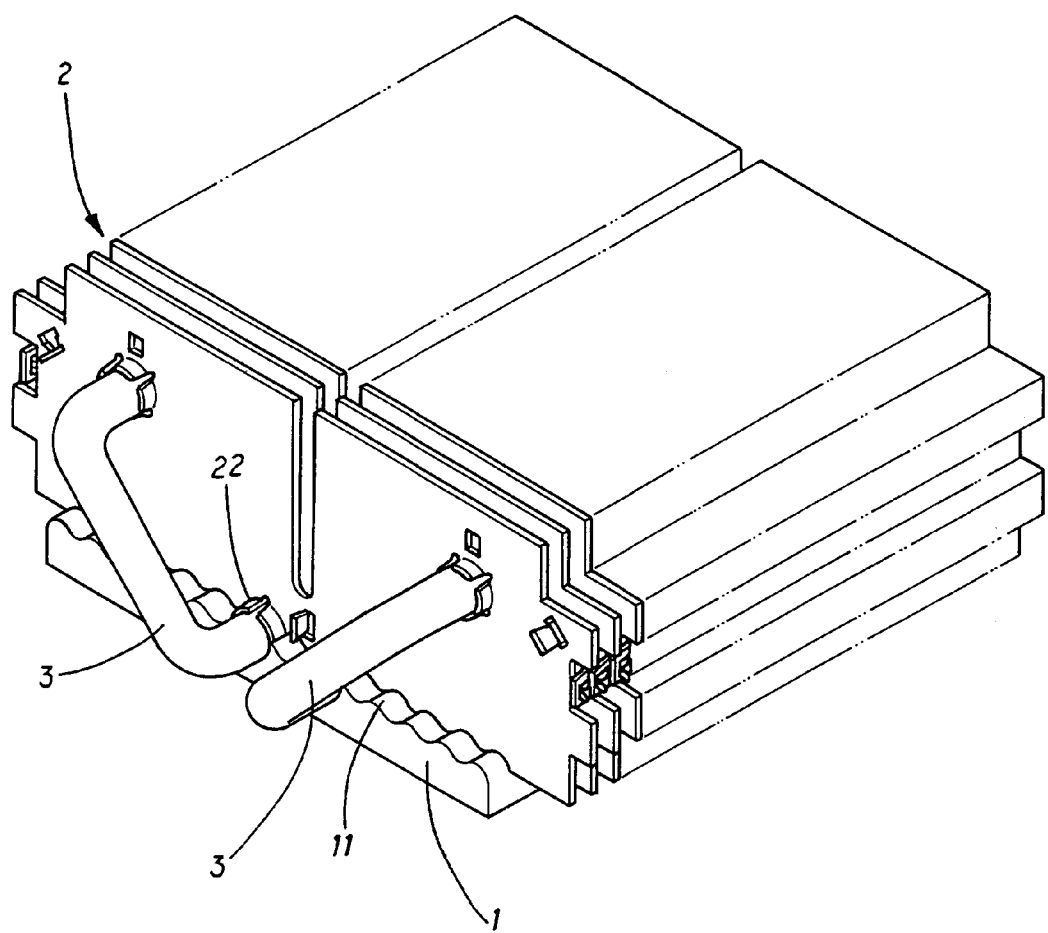
FIG. 4 is an assembled perspective view of the present invention.
Figure 5:
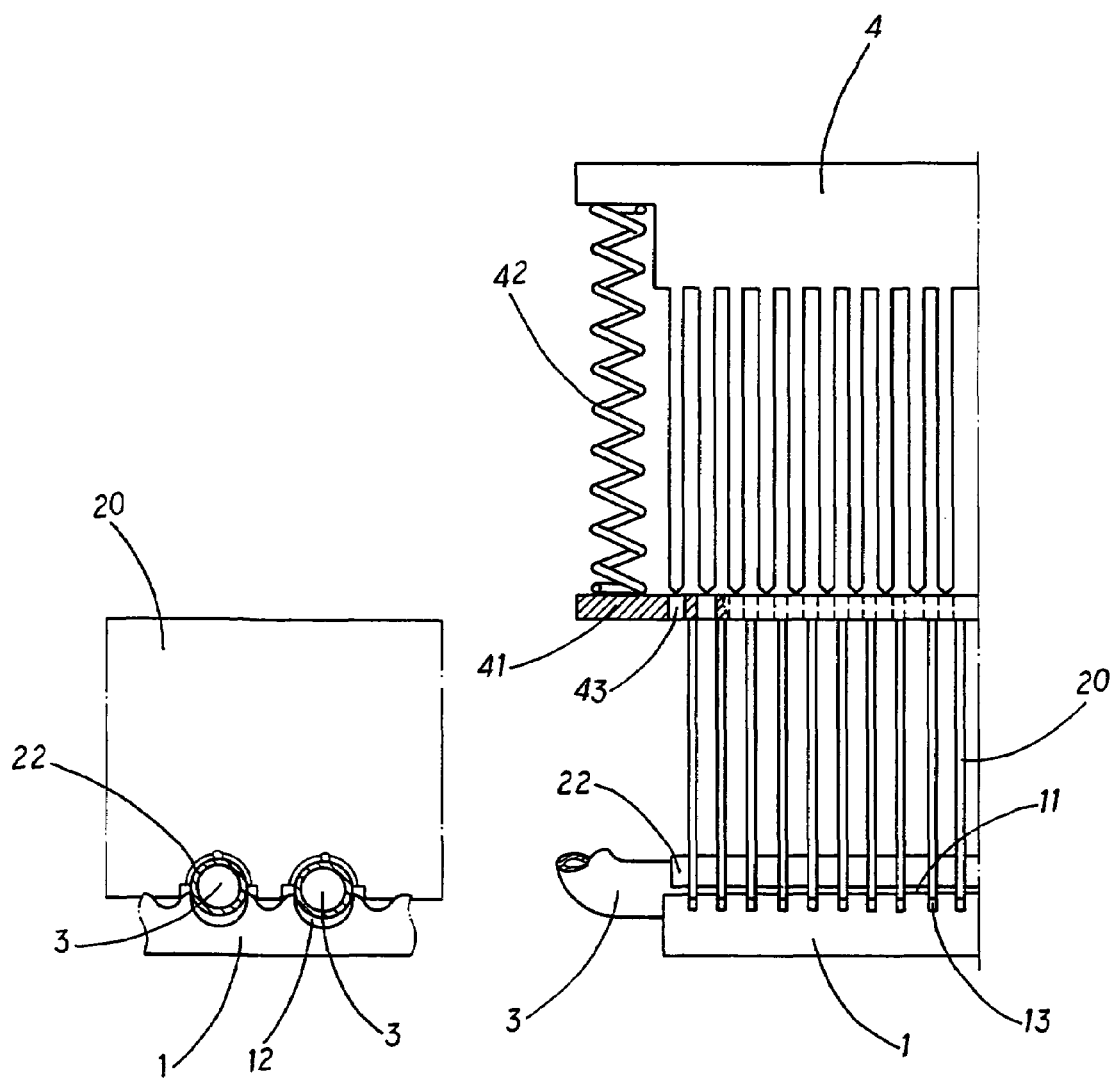
FIG. 5 is a plane view of the present invention.

With reference to FIGS. 3 to 5, the present invention comprises the following elements.

A heat dissipating unit 2 includes a plurality of fins 20. A bottom edge of each fin 20 has a plurality of concave portions 21.

A seat 1 is included. A surface of the seat 1 has a plurality of protruding surfaces 11. A top of the seat 1 has a plurality of trenches 12. Each trench 12 is parallel to at least one protruding surface 11. A plurality of recesses 13 are vertically passing through the plurality of trenches 12. The concave portions 21 are formed corresponding to the trenches 12 so that the fins 20 can be inserted into the recesses 13 so that the concave portions 21 cover upon the trenches 12.

A plurality of heat conductive tubes 3 are included. One end of each heat conductive tube 3 is installed between one respective trench 12 and respective concave portions 21 of the plurality of fins 20 so that the heat conductive tubes 3 are positioned in the seat 1.

Figure 6:
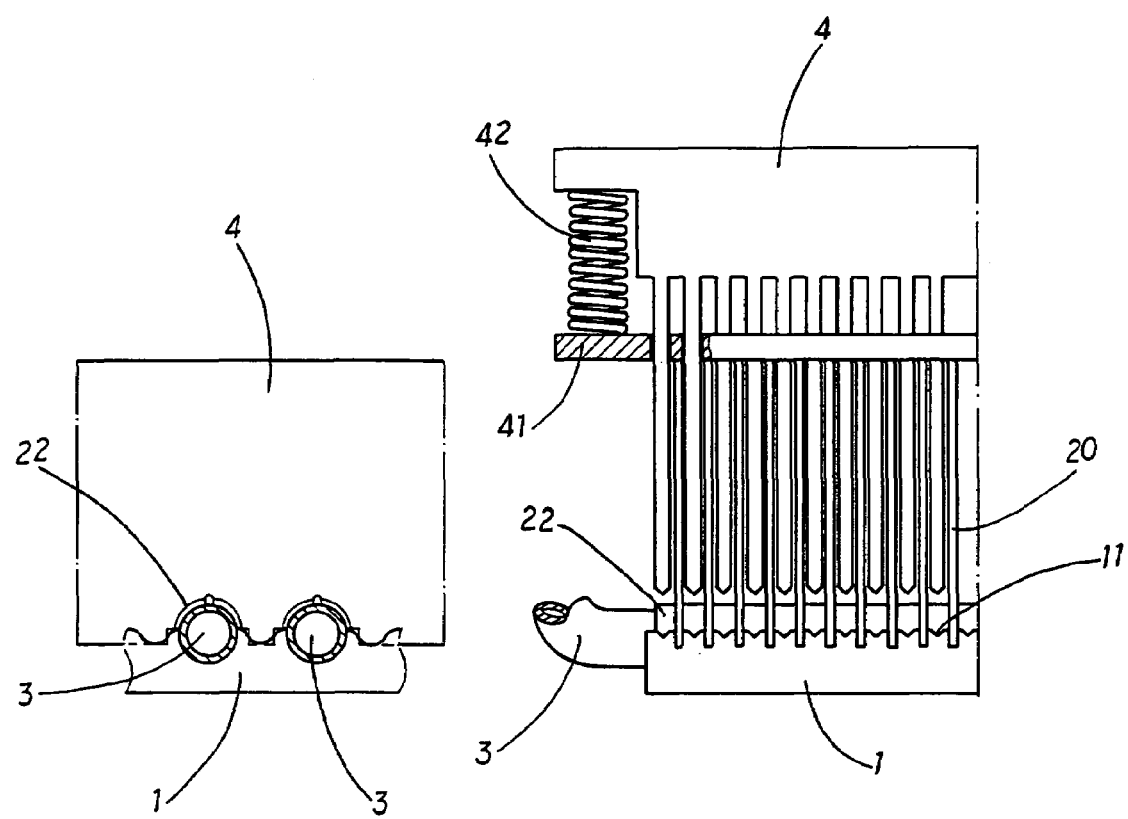
FIG. 6 shows the operation that a shaping mold punches the protruding surfaces according to the present invention.
Figure 7:
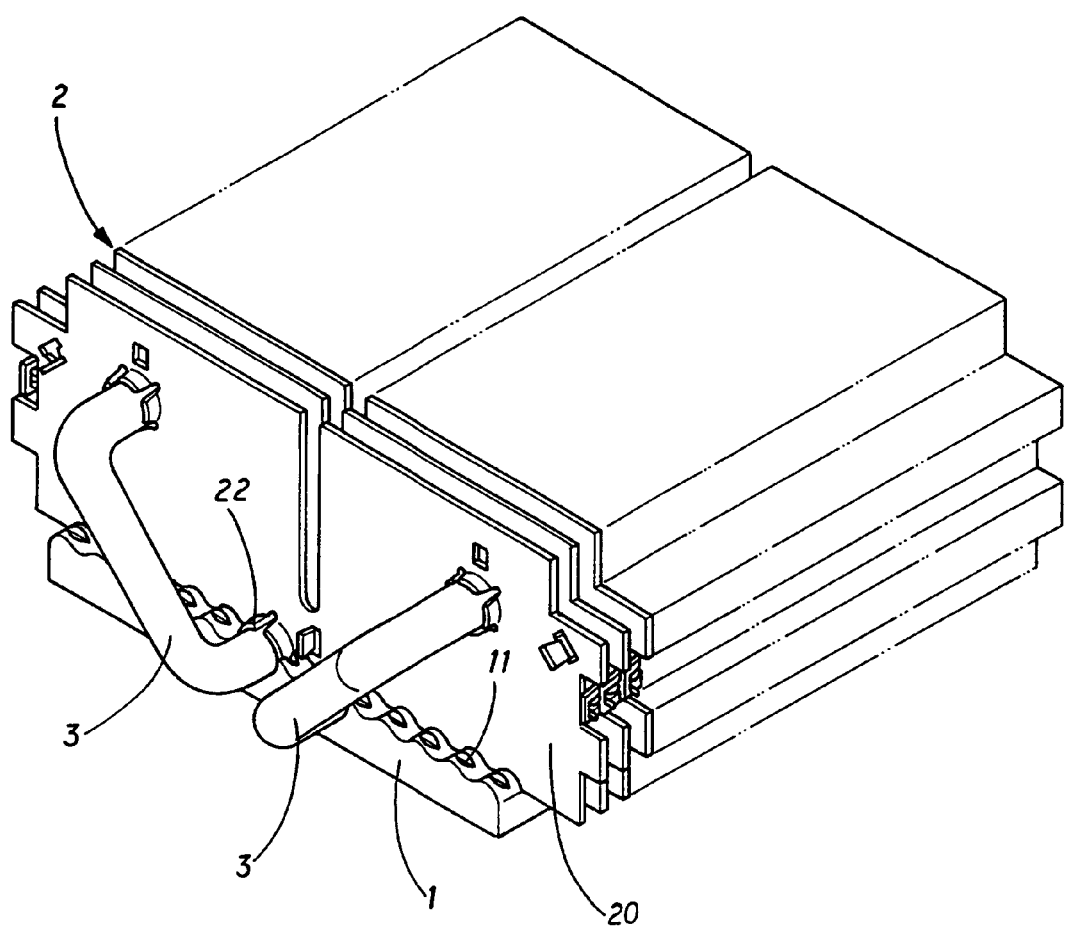
FIG. 7 is a perspective view showing that the heat conductive tubes are positioned in the fins and seat according to the present invention.

A shaping mold 4 serves to punch two sides of the protruding surfaces 11 of the seat 1, see FIG. 6, so that the fins 20 are riveted to the seat 1 and thus the heat conductive tubes 3 are positioned between the fins 20 and seat 1 (referring to FIG. 7).

Referring to FIGS. 3, 4, and 5, the plurality of concave portions 21 are installed on the bottom edges of the fins 20. A periphery of each concave portion 21 is installed with a peripheral wall 22 for tightly positioning a respective heat conductive tube 3.

With reference to FIGS. 5 and 6, the plane view and operation view of the present invention are illustrated. A bottom of the shaping mold 4 has a press plate 41. A plurality of springs 42 are installed between the press plate 41 and the shaping mold 4. The press plate 41 has a plurality of through holes 43. The shaping mold 4 has a plurality of punching plates (see FIG. 5) extending therefrom. In punching, the punching plates pass through the through holes 43 of the press plate 41 to enter into the space between the fins 20. Then the punching plates punch the protruding surfaces 11 at portions between two fins 20 so as to press the protruding surfaces 11 at two sides of the fins 20 to compress the fins 20. As a result the fins are tightly clamped within the recesses 13. Thereby, the heat dissipating unit 2 is riveted in the seat 1.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for forming a heat dissipating device with heat conductive tubes by using a shaping mold; a bottom of the shaping mold having a press plate; a plurality of springs being installed between the press plate and the shaping mold; the press plate having a plurality of through holes; the shaping mold having a plurality of punching plates extending therefrom; and a heat dissipating device with heat conductive tubes comprising: a heat dissipating unit including a plurality of fins; a bottom edge of each fin having a plurality of concave portions; a seat; a surface of the seat having a plurality of protruding surfaces; a top of the seat having a plurality of trenches; a plurality of recesses being vertically passing through the plurality of trenches; the concave portions being formed corresponding to the trenches so that the fins are inserted into the recesses so that the concave portions cover upon the trenches; a plurality of heat conductive tubes; one end of each heat conductive tube being installed between one respective trench and respective concave portions of the plurality of concave portions;

the method comprising the steps of:

passing the punching plates through the through holes of the press plate to enter into the space between the fins; and punching the punching plates upon the protruding surfaces at portions between two fins so as to press the protruding surfaces at two sides of the fins to compress the fins; as a result the fins are tightly clamped within the recesses; thereby, heat dissipating unit being riveted in the seat.

2. A heat dissipating device with heat conductive tubes comprising:

a heat dissipating unit including a plurality of fins;

a seat; a top of the seat having a plurality of trenches; a plurality of recesses being approximately vertically passing through the plurality of trenches; and the fins being inserted into the recesses; and a plurality of heat conductive tubes; one end of each heat conductive tube being installed between one respective trench so that the heat conductive tubes are positioned in the seat and a part of each heat conductive tube being passing through the plurality of fins;

wherein a bottom edge of each fin has a plurality of concave portions; the concave portions are formed corresponding to the trenches; the fins are inserted into the recesses and thus the concave portions cover upon the trenches;

wherein a periphery of each concave portion is installed with a peripheral wall for tightly positioning a respective heat conductive tube;

wherein a surface of the seat has a plurality of protruding surfaces; a top of the seat has a plurality of trenches; each trench is parallel to at least one protruding surface.

* * * * *